United States Patent
Kim et al.

(10) Patent No.: US 9,590,213 B2
(45) Date of Patent: Mar. 7, 2017

(54) ORGANIC LIGHT-EMITTING DISPLAY DEVICE, METHOD OF MANUFACTURING THE SAME, AND DONOR SUBSTRATE AND DONOR SUBSTRATE SET USED TO MANUFACTURE THE ORGANIC LIGHT-EMITTING DISPLAY DEVICE

(71) Applicant: Samsung Display Co., Ltd., Yongin, Gyeonggi-Do (KR)

(72) Inventors: Hyo Yeon Kim, Yongin (KR); Ha Jin Song, Yongin (KR); Sang-Woo Lee, Yongin (KR); Hye Yeon Shim, Yongin (KR); Heun Seung Lee, Yongin (KR); Kyul Han, Yongin (KR); Ji Hwan Yoon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/730,129

(22) Filed: Jun. 3, 2015

(65) Prior Publication Data

US 2015/0295207 A1    Oct. 15, 2015

Related U.S. Application Data

(62) Division of application No. 13/966,277, filed on Aug. 13, 2013, now Pat. No. 9,099,650.

(30) Foreign Application Priority Data

Mar. 26, 2013 (KR) ........................ 10-2013-0032291

(51) Int. Cl.
*H01L 21/00* (2006.01)
*H01L 51/56* (2006.01)
(Continued)

(52) U.S. Cl.
CPC ............. *H01L 51/56* (2013.01); *C23C 14/24* (2013.01); *H01L 51/0013* (2013.01);
(Continued)

(58) Field of Classification Search
CPC .. H01L 51/56; H01L 51/0013; H01L 51/5044
See application file for complete search history.

(56) References Cited

U.S. PATENT DOCUMENTS 6,890,627 B2 * 5/2005 Culver ................ H01L 51/0013
313/504
7,294,444 B2 * 11/2007 Kim ........................ B41M 5/265
428/32.77
(Continued)

FOREIGN PATENT DOCUMENTS

KR    10-2004-0104225 A    12/2004
KR    10-2007-0096082 A    10/2007
(Continued)

*Primary Examiner* — Laura Menz
(74) *Attorney, Agent, or Firm* — Lewis Roca Rothgerber Christie LLP

(57) ABSTRACT

An organic light-emitting display device, a method of manufacturing the same, and a donor substrate and a donor substrate set used to manufacture the organic light-emitting display device. According to an aspect of the present invention, there is provided an organic light-emitting display device comprising a substrate which comprises a green region and a red region, a plurality of first electrodes which are formed on the green region and the red region of the substrate, respectively, a plurality of light-emitting layers which are formed on the first electrodes and comprise a green light-emitting layer formed on the green region and a red light-emitting layer formed on the red region, and a second electrode which is formed on the light-emitting layers, wherein the green light-emitting layer comprises a first light-emitting layer which comprises a first host material and a first dopant material and a first buffer layer which (Continued)

is formed on the first light-emitting layer and comprises the first host material, and the red light-emitting layer comprises a second light-emitting layer which comprises a second host material and a second dopant material and a second buffer layer which is formed on the second light-emitting layer and comprises the first host material.

4 Claims, 8 Drawing Sheets

(51) Int. Cl.
    *H01L 51/00*     (2006.01)
    *C23C 14/24*     (2006.01)
    *H01L 51/50*     (2006.01)
    *H01L 27/32*     (2006.01)

(52) U.S. Cl.
    CPC ....... *H01L 27/3211* (2013.01); *H01L 51/5044* (2013.01); *H01L 2251/5384* (2013.01)

(56) References Cited

U.S. PATENT DOCUMENTS

| | | | |
|---|---|---|---|
| 7,767,489 B2* | 8/2010 | Kwon | H01L 51/0013 257/40 |
| 7,906,900 B2 | 3/2011 | Song et al. | |
| 7,977,864 B2* | 7/2011 | Bellmann | C09K 11/06 313/504 |
| 8,053,975 B2 | 11/2011 | Chun et al. | |
| 8,241,700 B2* | 8/2012 | Ikeda | C23C 14/048 427/146 |
| 8,541,777 B2 | 9/2013 | Hama et al. | |
| 8,686,448 B2 | 4/2014 | Shiratori | |
| 9,006,713 B2* | 4/2015 | Park | H01L 51/504 257/40 |
| 9,099,650 B2* | 8/2015 | Kim | H01L 51/0013 |
| 9,165,980 B2* | 10/2015 | Han | H01L 27/3211 |
| 9,165,981 B2* | 10/2015 | Seo | H01L 51/50 |
| 9,231,030 B2* | 1/2016 | Choi | H01L 27/32 |
| 9,269,918 B2* | 2/2016 | Lee | H01L 51/504 |
| 2006/0125379 A1 | 6/2006 | Liu et al. | |
| 2006/0188746 A1 | 8/2006 | Iou | |
| 2007/0207571 A1 | 9/2007 | Morisue et al. | |
| 2007/0257276 A1* | 11/2007 | Kwon | H01L 51/0013 257/192 |
| 2008/0026306 A1* | 1/2008 | Lamansky | B41M 5/52 430/31 |
| 2008/0113292 A1* | 5/2008 | Matsuo | H01L 51/0013 430/270.1 |
| 2008/0284324 A1 | 11/2008 | Chun et al. | |
| 2009/0026929 A1 | 1/2009 | Song et al. | |
| 2009/0091255 A1 | 4/2009 | Lee et al. | |
| 2009/0104835 A1* | 4/2009 | Aoyama | H01L 51/0013 445/58 |
| 2010/0038643 A1 | 2/2010 | Park et al. | |
| 2010/0055343 A1* | 3/2010 | Lee | B41M 5/38214 427/554 |
| 2010/0151762 A1* | 6/2010 | Ikeda | C23C 14/048 445/58 |
| 2011/0031876 A1 | 2/2011 | Park et al. | |
| 2011/0073884 A1 | 3/2011 | Lee | |
| 2011/0204337 A1 | 8/2011 | Dobbs et al. | |
| 2012/0056208 A1 | 3/2012 | Nishikawa et al. | |
| 2012/0299031 A1 | 11/2012 | Shiratori | |
| 2013/0001531 A1* | 1/2013 | Park | H01L 27/3211 257/40 |
| 2013/0001612 A1 | 1/2013 | Lee et al. | |
| 2013/0023071 A1* | 1/2013 | Noh | H01L 51/0013 438/26 |
| 2013/0043498 A1* | 2/2013 | Pyo | H01L 51/0013 257/89 |
| 2013/0175508 A1 | 7/2013 | Kwon et al. | |
| 2013/0264560 A1 | 10/2013 | Dobbs et al. | |
| 2013/0302572 A1 | 11/2013 | Sonoda et al. | |
| 2014/0054556 A1 | 2/2014 | Park et al. | |
| 2014/0077688 A1 | 3/2014 | Weaver et al. | |
| 2014/0117332 A1 | 5/2014 | Lee | |
| 2014/0175391 A1* | 6/2014 | Song | H01L 51/5008 257/40 |
| 2014/0191209 A1* | 7/2014 | Han | H01L 27/3211 257/40 |
| 2014/0217367 A1 | 8/2014 | Song et al. | |
| 2014/0284566 A1 | 9/2014 | Yoo et al. | |
| 2014/0291627 A1* | 10/2014 | Kim | H01L 51/0013 257/40 |
| 2014/0322842 A1* | 10/2014 | Hwang | B41M 5/38242 438/28 |
| 2014/0326957 A1 | 11/2014 | Lee | |
| 2014/0353596 A1 | 12/2014 | Kim et al. | |
| 2014/0353610 A1* | 12/2014 | Lee | H01L 51/504 257/40 |
| 2014/0374705 A1 | 12/2014 | Song et al. | |
| 2014/0374707 A1* | 12/2014 | Seo | H01L 51/50 257/40 |
| 2015/0090972 A1* | 4/2015 | Lee | H01L 27/3211 257/40 |
| 2015/0295207 A1* | 10/2015 | Kim | H01L 51/56 118/715 |
| 2016/0118587 A1* | 4/2016 | Lee | H01L 51/504 438/35 |
| 2016/0126456 A1* | 5/2016 | Kwon | H01L 51/56 438/34 |

FOREIGN PATENT DOCUMENTS

| | | |
|---|---|---|
| KR | 10-2008-0065839 A | 7/2008 |
| KR | 10-2011-0040244 A | 4/2011 |

\* cited by examiner

200

ORGANIC LIGHT-EMITTING DISPLAY DEVICE, METHOD OF MANUFACTURING THE SAME, AND DONOR SUBSTRATE AND DONOR SUBSTRATE SET USED TO MANUFACTURE THE ORGANIC LIGHT-EMITTING DISPLAY DEVICE

CROSS-REFERENCE TO RELATED APPLICATION

This application is a divisional of U.S. patent application Ser. No. 13/966,277, filed Aug. 13, 2013, which claims priority to and the benefit of Korean Patent Application No. 10-2013-0032291, filed Mar. 26, 2013, the entire content of both of which is incorporated herein by reference.

BACKGROUND

1. Field

The present invention relates to an organic light-emitting display device, a method of manufacturing the same, and a donor substrate and a donor substrate set used to manufacture the organic light-emitting display device.

2. Description of the Related Art

Generally, an organic light-emitting display device includes an anode, a cathode, and organic layers interposed between the anode and the cathode. The organic layers include at least a light-emitting layer and may further include a hole injection layer, a hole transport layer, an electron transport layer and an electron injection layer, in addition to the light-emitting layer. The organic light-emitting display device is classified as a polymer organic light-emitting display device or a small molecule organic light-emitting display device depending on the material that forms the organic layer, particularly, the light-emitting layer.

In order to realize a full-color organic light-emitting display device, it is required to pattern the light-emitting layer. The light-emitting layer may be patterned using a fine metal mask (FMM) in the case of the small molecule organic light-emitting display device and using inkjet printing or laser induced thermal imaging (LITI) in the case of the polymer organic light-emitting display device. Among others, the LITI method has the advantages of finely patterning the organic layer as well as being a dry process instead of a wet process as in the inkjet printing method.

In order to form the pattern of the polymer organic layer using the LITI method, at least a light source, a substrate for an organic light-emitting display device, i.e., a device substrate, and a donor substrate are required. The donor substrate includes a base film, a light-to-heat conversion layer, and a transfer layer composed of an organic layer. The patterning of the organic layer on the device substrate is performed while light emitted from the light source is absorbed into the light-to-heat conversion layer and converted into heat energy. The organic layer composing the transfer layer is transferred onto the device substrate by the heat energy.

Different base films may be used for a donor substrate for forming a green light-emitting layer and a donor substrate for forming a red light-emitting layer. In addition, a buffer layer inserted between the base film of the donor substrate for forming the green light-emitting layer and a transfer layer for forming the green light-emitting layer may be different from a buffer layer inserted between the base film of the donor substrate for forming the red light-emitting layer and a transfer layer for forming the red light-emitting layer. If different base films and buffer layers are used, the number of process variables may increase, and it may be difficult to identify the cause of defects. Furthermore, an organic light-emitting display device manufactured using the LITI method with different base films and buffer layers may have low luminous efficiency and a short lifetime.

SUMMARY

Aspects of the present invention provide an organic light-emitting display device which has high luminous efficiency and a long lifetime.

Aspects of the present invention also provide a donor substrate set which uses the same base film and the same buffer layer.

Aspects of the present invention also provide a single donor substrate which uses a common base film and a common buffer layer.

Aspects of the present invention also provide a method of manufacturing an organic light-emitting display device using a donor substrate set which uses the same base film and the same buffer layer or a single donor substrate which uses a common base film and a common buffer layer.

However, aspects of the present invention are not restricted to the one set forth herein. The above and other aspects of the present invention will become more apparent to one of ordinary skill in the art to which the present invention pertains by referencing the detailed description of the present invention given below.

According to an embodiment of the present invention, there is provided a organic light-emitting display device including: a substrate including a green region and a red region; a plurality of first electrodes, the plurality of first electrodes including a plurality of green region first electrodes and a plurality of red region first electrodes; the plurality of green region first electrodes being on the green region of the substrate, and the plurality of red region first electrodes being on the red region of the substrate; a plurality of light-emitting layers on the first electrodes, the plurality of light-emitting layers including a green light-emitting layer on the green region and a red light-emitting layer on the red region; and a second electrode on the light-emitting layers, the green light-emitting layer including a first light-emitting layer including: a first host material; and a first dopant material; and a first buffer layer on the first light-emitting layer, including the first host material, and the red light-emitting layer including: a second light-emitting layer including: a second host material; and a second dopant material, and a second buffer layer on the second light-emitting layer including the first host material.

In one embodiment, the substrate further includes a blue region, and the light-emitting layers further include a blue light-emitting layer on the blue region.

In one embodiment, the blue light-emitting layer extends into the green region and the red region and overlaps with the green light-emitting layer and the red light-emitting layer.

In one embodiment, the green light-emitting layer and the red light-emitting layer are directly on the blue light-emitting layer.

In one embodiment, the blue light-emitting layer includes a third host material and a third dopant material.

In one embodiment, the display includes: a first medium layer configured to inject or transport electrons or holes between the first electrodes and the blue light-emitting layer; and a second medium layer configured to inject or transport electrons or holes between the light-emitting layers and the second electrode.

In one embodiment, the first buffer layer does not include the first dopant material; and the second buffer layer does not include the second dopant material.

In one embodiment, the green light-emitting layer includes a first auxiliary layer under the first light-emitting layer, and the red light-emitting layer includes a second auxiliary layer under the second light-emitting layer.

In one embodiment, a height of the second auxiliary layer is greater than a height of the first auxiliary layer.

In one embodiment, the display includes a passivation layer formed on the second electrode configured to protect the second electrode and structures under the second electrode.

According to an embodiment of the present invention, there is provided a donor substrate set including: a first donor substrate; and a second donor substrate, the first donor substrate including: a first base film; a transfer layer for forming a first buffer layer, the transfer layer for forming the first buffer layer being on the first base film and including a first host material; and a transfer layer for forming a first light-emitting layer, the transfer layer for forming the first light-emitting layer being on the transfer layer for forming the first buffer layer, the transfer layer for forming the first light-emitting layer including the first host material and a first dopant material, and the second donor substrate including: a second base film, a transfer layer for forming a second buffer layer, the transfer layer for forming the second buffer layer being on the second base film and including the first host material; and a transfer layer for forming a second light-emitting layer, the transfer layer for forming the second light-emitting layer being on the transfer layer for forming the second buffer layer and including a second host material and a second dopant material.

In one embodiment, the first base film and the second base film are composed of the same material.

In one embodiment, the transfer layer for forming the first buffer layer and the transfer layer for forming the second buffer layer are composed of the same material.

In one embodiment, the transfer layer for forming the first buffer layer does not include the first dopant material; and the transfer layer for forming the second buffer layer does not include the second dopant material.

In one embodiment, the donor includes: a transfer layer for forming a first auxiliary layer, the transfer layer for forming the first auxiliary layer being on the transfer layer for forming the first light-emitting layer; and a transfer layer for forming a second auxiliary layer, the transfer layer for forming the second auxiliary layer being on the transfer layer for forming the second light-emitting layer.

In one embodiment, the donor includes: a first light-to-heat conversion layer between the first base film and the transfer layer for forming the first buffer layer; and a second light-to-heat conversion layer between the second base film and the transfer layer for forming the second buffer layer.

In one embodiment, the donor includes: a first intermediate layer between the first light-to-heat conversion layer and the transfer layer for forming the first buffer layer; and a second intermediate layer between the second light-to-heat conversion layer and the transfer layer for forming the second buffer layer.

According to an embodiment of the present invention, there is provided a donor substrate including: a base film including a first region and a second region; a buffer layer on the base film, the buffer layer including a first host material; a transfer layer for forming a first light-emitting layer, the transfer layer for forming the first light-emitting layer being on the first region of the buffer layer and including the first host material and a first dopant material; and a transfer layer for forming a second light-emitting layer, the transfer layer for forming the second light-emitting layer being on the second region of the buffer layer and including a second host material and a second dopant material.

In one embodiment, the donor includes: a transfer layer for forming a first auxiliary layer, the transfer layer for forming the first auxiliary layer being on the transfer layer for forming the first light-emitting layer; and a transfer layer for forming a second auxiliary layer, the transfer layer for forming the second auxiliary layer being on the transfer layer for forming the second light-emitting layer.

In one embodiment, the donor includes a light-to-heat conversion layer which is formed between the base film and the buffer layer.

In one embodiment, the donor includes an intermediate layer between the light-to-heat conversion layer and the buffer layer.

According to an embodiment of the present invention, there is provided a method of manufacturing an organic light-emitting display device, the method including: preparing a substrate having a plurality of first electrodes respectively formed on a first region and a second region of the substrate; placing a first donor substrate including a first base film, a transfer layer for forming a first buffer layer, the transfer layer for forming the first buffer layer being on the first base film and including a first host material, and a transfer layer for forming a first light-emitting layer, the transfer layer for forming the first light-emitting layer being on the transfer layer for forming the first buffer layer and including the first host material and a first dopant material, such that the transfer layer for forming the first light-emitting layer faces the substrate with a gap between the transfer layer for forming the first light-emitting layer and the substrate; and forming a first organic layer pattern on the first electrode of the first region by transferring the transfer layer for forming the first buffer layer and the transfer layer for forming the first light-emitting layer onto the first electrode of the first region by irradiating the first region with a laser beam.

In one embodiment, the method includes, after the forming of the first organic layer pattern on the first electrode of the first region: placing a second donor substrate including a second base film, a transfer layer for forming a second buffer layer, the transfer layer for forming the second buffer layer being on the second base film and including the first host material, and a transfer layer for forming a second light-emitting layer, the transfer layer for forming the second light-emitting layer being formed on the transfer layer for forming the second buffer layer and including a second host material and a second dopant material, such that the transfer layer for forming the second light-emitting layer faces the substrate with a gap between the transfer layer for forming the second light-emitting layer and the substrate; and forming a second organic layer pattern on the first electrode of the second region by transferring the transfer layer for forming the second buffer layer and the transfer layer for forming the second light-emitting layer onto the first electrode of the second region by irradiating the second region with a laser beam.

In one embodiment, the method includes, after the forming of the second organic layer pattern on the first electrode of the second region, forming a second electrode on the first organic layer pattern and the second organic layer pattern.

According to an embodiment of the present invention there is provided a method of manufacturing an organic light-emitting display device, the method including: preparing a substrate having a plurality of first electrodes formed on a first region and a second region of the substrate; placing a donor substrate including a base film, a buffer layer on the base film and including a first host material, a transfer layer for forming a first light-emitting layer, the transfer layer for forming the first light-emitting layer being on the buffer layer of the first region and including the first host material and a first dopant material, and a transfer layer for forming a second light-emitting layer, the transfer layer for forming the second light-emitting layer being on the buffer layer of the second region and including a second host material and a second dopant material, such that the transfer layer for forming the first light-emitting layer and the transfer layer for forming the second light-emitting layer face the substrate with a gap between: the transfer layer for forming the first light-emitting layer and the transfer layer for forming the second light-emitting layer; and the substrate; and forming organic layer patterns on the first electrodes by transferring the buffer layer, the transfer layer for forming the first light-emitting layer and the transfer layer for forming the second light-emitting layer onto the first electrodes by irradiating the first region and the second region with a laser beam.

In one embodiment, the method includes, after the forming of the organic layer patterns on the first electrodes, forming a second electrode on the organic layer patterns.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Figure 1:
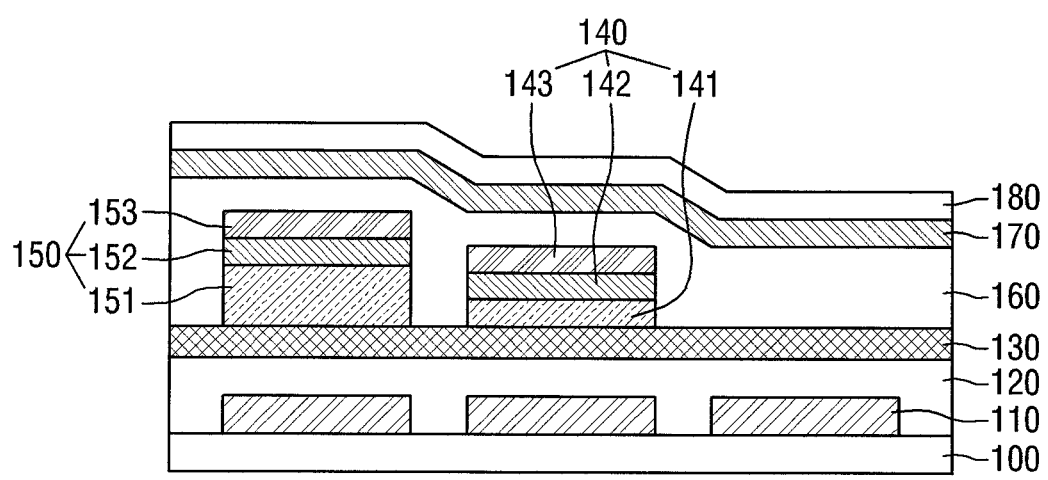
FIG. 1 is a cross-sectional view of an organic light-emitting display device according to an embodiment of the present invention.

Aspects and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures are schematic representations and shapes of regions shown in figures exemplify specific shapes of regions of elements and do not limit aspects of the invention.

Hereinafter, embodiments of the present invention will be described with reference to the attached drawings.

FIG. 1 is a cross-sectional view of an organic light-emitting display device according to an embodiment of the present invention. Referring to FIG. 1, the organic light-emitting display device includes a substrate 100, a plurality of first electrodes 110 which are formed on the substrate 100, a plurality of light-emitting layers which are formed on the first electrodes 110 and include a blue light-emitting layer 130, a green light-emitting layer 140 and a red light-emitting layer 150, and a second electrode 170 which is formed on the light-emitting layers.

The substrate 100 may include an insulating substrate. The insulating substrate may be formed of a transparent glass material containing transparent $SiO_2$ as its main component. In some embodiments, the insulating substrate may be formed of an opaque material or a plastic material. Further, the insulating substrate may be a flexible substrate that can be bent, folded or rolled.

Although not shown in FIG. 1, the substrate 100 may further include other structures formed on the insulating substrate. Examples of the structures may include wiring lines, electrodes, insulating layers, etc. If the organic light-emitting display device according to the current embodiment is an active matrix organic light-emitting display device, the substrate 100 may include a plurality of thin-film transistors (TFTs) formed on the insulating substrate. Each of the TFTs may include a gate electrode, a source electrode, a drain electrode and a semiconductor layer which is a channel region. The semiconductor layer may be formed of amorphous silicon, polycrystalline silicon, or monocrystalline silicon. In an alternative embodiment, the semiconductor layer may be formed of an oxide semiconductor. The drain electrode of each of at least some of the TFTs may be electrically connected to a corresponding one of the first electrodes 110.

The substrate 100 may include a blue region, a green region and a red region. The blue region, the green region and the red region may emit light of blue, green and red colors, respectively. In an exemplary embodiment, the blue region, the green region and the red region of the substrate 100 may be separated from each other by a predetermined distance.

The first electrodes 110 are formed on the substrate 100. The first electrodes 110 may be separated from each other and may correspond to a plurality of pixels, respectively. Although not shown in FIG. 1, a pixel defining layer may be interposed between the first electrodes 110 of different pixels to define the pixels. The pixel defining layer may be formed on the substrate 100 and may include openings which expose regions in which the first electrodes 110 of the pixels are to be formed, respectively. The pixel defining layer may be formed of at least one organic material selected from benzocyclobutene (BCB), polyimide (PI), polyamaide (PA), acrylic resin and phenolic resin or may be formed of an inorganic material such as silicon nitride.

The first electrodes 110 may be anodes or cathodes. If the first electrodes 110 are anodes, the second electrode 170 may be a cathode. A case where the first electrodes 110 are anodes will hereinafter be described as an example. However, this is merely an example, and the first electrodes 110 may also be cathodes, and the second electrode 170 may also be an anode.

The first electrodes 110 used as anodes may be formed of a conductive material with a high work function. In a bottom emission organic light-emitting display device, the first electrodes 110 may be formed of ITO, IZO, ZnO, $In_2O_3$, or a stack of these materials. In a top emission organic light-emitting display device, each of the first electrodes 110 may further include a reflective layer formed of Ag, Mg, Al, Pt, Pd, Au, Ni, Nd, Ir, Cr, Li or Ca. The structure of the first electrodes 110 can be modified in various forms. For example, the first electrodes 110 may consist of two or more layers of two or more different materials selected from the above materials.

The first electrodes 110 may be formed in the blue region, the green region and the red region. The first electrodes 110 may be formed on the substrate 100 to directly contact the substrate 100, or a material such as an insulating layer may be interposed between the first electrodes 110 and the substrate 100. The phrases "green region" and "red region" may be used herein to denote these regions respectively, or as attributive adjective phrases, to identify, for example, the first electrodes in these regions. Thus, for example, a first electrode in the green region may be referred to herein as a "green region first electrode."

A first medium layer 120 may be formed on the first electrodes 110. The first medium layer 120 may help the injection or transportation of electrons or holes between the first electrodes 110 and the second electrode 170. If the first electrodes 110 are anodes, the first medium layer 120 may be a layer related to the injection or transportation of holes. For example, the first medium layer 120 may include a hole injection layer or a hole transport layer only or may include a stack of the hole injection and the hole transport layer. The hole injection layer or the hole transport layer may be formed using various methods including vapor deposition, spin coating, casting, and LB methods. The vapor deposition method may be used.

When the hole injection or the hole transport layer is formed by the vapor deposition method, its deposition conditions may vary according to a compound used as the material that forms the hole injection layer or the hole transport layer and the intended structure and thermal characteristics of the hole injection layer or the hole transport layer. The deposition conditions of the hole injection layer or the hole transport layer may include a deposition temperature ranging from 100 to 500° C., a vacuum level ranging from $10^{-8}$ to $10^{-3}$ torr, and a deposition rate ranging from 0.01 to 100 Å/sec.

The material that forms the hole injection layer may be selected from known hole injection materials including, but not limited to, a phthalocyanine compound such as copper phthalocyanine, a starburst type amine derivative such as TCTA or m-MTDATA, a conductive polymer such as polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly (4-styrene-sulfonate)(PANI/PSS).

The material that forms the hole transport layer may be selected from known hole transport materials including, but not limited to, 1,3,5-tricarbazolyl benzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)-silane, N,N'-bis(3-methylphenyl)-N,N'-diphenyl-[1,1-biphenyl]-4,4'-diamine (TPD), N,N'-di(naphthalene-1-yl)-N,N'-diphenyl benzidine (NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine) (TFB), and poly(9,9-dioctylfluorene-co-bis-(4-butylphenyl)-bis-N,N-phenyl-1,4-phenylenediamine) (PFB).

The first medium layer 120 may be divided into a plurality of sections corresponding respectively to the pixels. Alternatively, the first medium layer 120 may be formed as a single piece over the entire organic light-emitting display device, as shown in FIG. 1. That is, the first medium layer 120 may be formed as a common layer regardless of the division between the pixels.

The blue light-emitting layer 130 is formed on the first medium layer 120. The blue light-emitting layer 130 may be formed in the blue region. The blue light-emitting layer 130 may be formed of a polymer material or a small molecule organic material which uniquely emits blue light or a mixture of the polymer material and the small molecule organic material. In some embodiments, the blue light-emitting layer 130 may include a blue host material and a blue dopant material.

The blue host material of the blue light-emitting layer 130 may include one or more materials selected from, but not limited to, an anthracene derivative and a carbazole compound. The anthracene derivative may be 9,10-(2-dinaphthyl) anthracene (ADN), and the carbazole compound may be 4,4'-(carbazole-9-yl)biphenyl (CBP).

The blue dopant material of the blue light-emitting layer 130 may be, but is not limited to being, $F_2Irpic$, $(F_2ppy)_2Ir$ (tmd), $It(dfppz)_3$, ter-fluorene, etc.

The blue light-emitting layer 130, like the first medium layer 120, may be formed as a common layer regardless of the division between the pixels. That is, the blue light-emitting layer 130 may be formed not only in the blue region but may also extend to the green region and the red region to be overlapped by the green light-emitting layer 140 and the red light-emitting layer 150. In an exemplary embodiment, the green light-emitting layer 140 and the red light-emitting layer 150 may be formed directly on the blue light-emitting layer 130.

In the green region, the green light-emitting layer 140 may be formed on the blue light-emitting layer 130. In the red region, the red light-emitting layer 150 may be formed on the blue light-emitting layer 130. The green light-emitting layer 140 and the red light-emitting layer 150 may be formed by, but not limited to, a laser induced thermal imaging (LITI) method. A second medium layer 160 may be formed on the green light-emitting layer 140 and the red light-emitting layer 150. In the green region and the red region, the blue light-emitting layer 130, like the first medium layer 120, may transport carriers, and its light emission may be limited. On the other hand, in the blue region, the second medium layer 160 may be formed on the blue light-emitting layer 130 with no light-emitting layer interposed therebetween. In the blue region, the blue light-emitting layer 130 may emit light of its unique color, i.e., blue light. The second medium layer 160 will be described in more detail later.

The green light-emitting layer 140 may include a first auxiliary layer 141, a first light-emitting layer 142, and a first buffer layer 143 stacked sequentially.

The first auxiliary layer 141 may adjust a thickness of the green light-emitting layer 140 in order to control the resonance cycle of green light. In order to increase the luminous efficiency, color purity, etc. of green light, a thickness of the first auxiliary layer 141 may be set in a range of 300 to 1500 Å. The first auxiliary layer 141 may be formed only in the green region by using a fine metal mask (FMM). The material that forms the first auxiliary layer 141 may be, but is not limited to being, identical to the material that forms the hole transport layer. In an exemplary embodiment, the first auxiliary layer 141 may include at least one material selected from silicon nitride (SiNx), silicon oxide ($SiO_2$), and silicon oxynitride (SiON).

The first light-emitting layer 142 may be formed of a polymer material or a small molecule organic material which uniquely emits green light or a mixture of the polymer material and the small molecule organic material. In some embodiments, the first light-emitting layer 142 may include a green host material and a green dopant material.

The green host material (a first host material) of the first light-emitting layer 142 may include one or more materials selected from, but not limited to, an anthracene derivative and a carbazole compound. The anthracene derivative may be ADN, and the carbazole compound may be CBP.

The green dopant material (a first dopant material) of the first light-emitting layer 142 may be, but is not limited to, $Ir(ppy)_3$ (ppy=phenylpyridine), $Ir(ppy)_2(acac)$, $Ir(mpyp)_3$, or C545T.

The first buffer layer 143 may include the first host material. That is, the first buffer layer 143 may not include the first dopant material. In an exemplary embodiment, the first buffer layer 143 may be formed of the first host material only.

The red light-emitting layer 150 may include a second auxiliary layer 151, a second light-emitting layer 152, and a second buffer layer 153 stacked sequentially.

The second auxiliary layer 151 may adjust a thickness of the red light-emitting layer 150 in order to control the resonance cycle of red light. In order to increase the luminous efficiency, color purity, etc. of red light, a thickness of the second auxiliary layer 151 may be set in a range of 500 to 1800 Å. In an exemplary embodiment, a height of the second auxiliary layer 151 may be greater than a height of the first auxiliary layer 141. The second auxiliary layer 151 may be formed only in the red region by using an FMM. The material that forms the second auxiliary layer 151 may be, but is not limited to being, identical to the material that forms the hole transport layer. In an exemplary embodiment, the second auxiliary layer 151 may include at least one material selected from SiNx, $SiO_2$, and SiON.

The second light-emitting layer 152 may be formed of a polymer material or a small molecule organic material which uniquely emits red light or a mixture of the polymer material and the small molecule organic material. In some embodiments, the second light-emitting layer 152 may include a red host material and a red dopant material.

The red host material (a second host material) of the second light-emitting layer 152 may include, but not be limited to, one or more materials selected from the group consisting of bis(2-(2-hydroxyphenyl)benzothiazolato)zinc (Zn(BTZ)2) and bis-(2-methyl-8-quinolinolate)-4-(phenylphenolate)aluminum.

The red dopant material (a second dopant material) of the second light-emitting layer 152 may be, but is not limited to being, PtOEP, $Ir(piq)_3$, $Btp_2Ir(acac)$, DCJTB, etc.

The second buffer layer 153 may include the first host material. That is, the second buffer layer 153 may not include the second dopant material. In an exemplary embodiment, the second buffer layer 153 may be formed of the first host material only. In another exemplary embodiment, the second buffer layer 153 may be formed of the same material as the first buffer layer 143.

The second medium layer 160 may be formed on the light-emitting layers not covered with the pixel defining layer. The second medium layer 160 may help the injection or transportation of electrons or holes between the first electrodes 110 and the second electrode 170. If the second electrode 170 is a cathode, the second medium layer 160 may be a layer related to the injection or transportation of electrons. For example, the second medium layer 160 may include an electron transport layer or an electron injection layer only or may include a stack of the electron transport layer and the electron injection layer.

The electron transport layer or the electron injection layer may be formed using various methods including vapor deposition and spin coating. When the electron transport layer or the electron injection layer is formed using vapor deposition or spin coating, the deposition or coating conditions may vary according to the compound used, but are generally almost the same as those for the formation of the hole injection layer.

The material that forms the electron transport layer may be a material that can stably transport electrons injected from a cathode. The material may be, but is not limited to, a quinoline derivative, in particular, a known material such as tris(8-quinolinorate)aluminum ($Alq_3$), 3-(4-biphenylyl)-4-phenyl-5-(4-tert-butyl phenyl)-1,2,4-triazole (TAZ), Balq, etc.

The electron injection layer may be formed of a known material such as, but not limited to, LiF, NaCl, CsF, $Li_2O$, BaO, etc.

The second medium layer 160 may extend onto side and top surfaces of the pixel defining layer. The second medium layer 160 may be divided into a plurality of sections corresponding respectively to the pixels. Alternatively, the second medium layer 160 may be formed as a single piece over the entire organic light-emitting display device, as shown in FIG. 1. That is, the second medium layer 160 may be formed as a common layer regardless of the division between the pixels. In some embodiments, the second medium layer 160 may be omitted.

The second electrode 170 is formed on the second medium layer 160. The second electrode 170 used as a cathode may be formed of a conductive material with a low work function. The second electrode 170 may be formed of Ag, Mg, Al, Pt, Pd, Au, Ni, Nd, Ir, Cr, Li or Ca.

A passivation layer 180 may be disposed on the second electrode 170. The passivation layer 170 may be formed of an insulating material. A spacer (not shown) may be disposed between the second electrode 170 and the passivation layer 180. In some other embodiments of the present invention, the passivation layer 180 may be omitted. In this case, an encapsulation layer formed of an insulating material may cover the entire structure to protect the structure.

Figure 2:
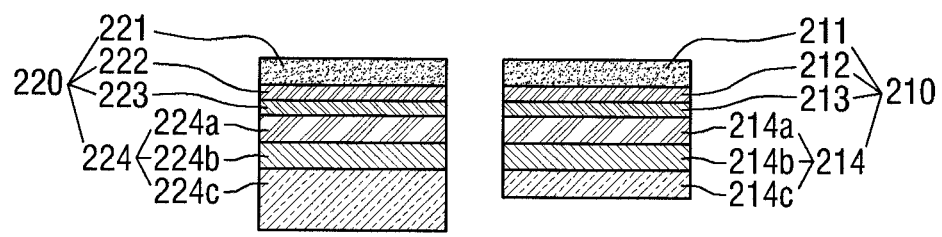
FIG. 2 is a cross-sectional view of a donor substrate set according to an embodiment of the present invention.

The organic light-emitting display device according to the current embodiment can be manufactured using a donor substrate set 200 which will be described below. FIG. 2 is a cross-sectional view of a donor substrate set 200 according to an embodiment of the present invention. Referring to FIG. 2, the donor substrate set 200 may include a first donor substrate 210 and a second donor substrate 220.

The first donor substrate 210 may include a first base film 211, a first light-to-heat conversion layer 212, a first intermediate layer 213, and a transfer layer 214 for forming a green light-emitting layer.

The first base film 211 may be formed of transparent polymer, which includes polyester such as polyethylene terephthalate, polyacryl, polyepoxy, polyethylene, polystyrene, and the like. Among these examples, the polyethylene terephthalate film is mainly used. The first base film 211 should have optical properties and mechanical stability as a support film. The first base film 211 may have a thickness of 10 to 500 μm.

The first light-to-heat conversion layer 212 may be disposed on the first base film 211. The first light-to-heat conversion layer 212 absorbs light in the infrared-visible range and converts some of the light into heat. To this end, the first light-to-heat conversion layer 212 should have a suitable optical density and includes a light absorbing material. The first light-to-heat conversion layer 212 may be a metal layer which contains aluminum oxide or aluminum sulfide as the light absorbing material or a polymer organic layer which contains carbon black, graphite or infrared dye as the light absorbing material. If the first light-to-heat conversion layer 212 is a metal layer, it may be formed to a thickness of 100 to 5,000 Å by vacuum deposition, electron beam deposition or sputtering. If the first light-to-heat conversion layer 212 is a polymer organic layer, it may be formed to a thickness of 0.1 to 10 μm by typical film coating methods such as roll coating, gravure coating, extrusion coating, spin coating, and knife coating.

The first intermediate layer 213 may be formed on the first light-to-heat conversion layer 212. The first intermediate layer 212 may prevent the light absorbing material (e.g., carbon black) of the first light-to-heat conversion layer 212 from contaminating the transfer layer 214 formed in a subsequent process. The first intermediate layer 213 may be formed of acrylic resin or alkyd resin. The first intermediate layer 213 may be formed by a typical coating process such as solvent coating and a curing process such as ultraviolet curing.

The transfer layer 214 for forming the green light-emitting layer may be disposed on the first intermediate layer 213. The transfer layer 214 for forming the green light-emitting layer may include a transfer layer 214a for forming a first buffer layer, a transfer layer 214b for forming a first light-emitting layer, and a transfer layer 214c for forming a first auxiliary layer stacked sequentially on the first intermediate layer 213.

The transfer layer 214a for forming the first buffer layer, the transfer layer 214b for forming the first light-emitting layer, and the transfer layer 214c for forming the first auxiliary layer may be formed of the same materials as the first buffer layer 143, the first light-emitting layer 142, and the first auxiliary layer 141, respectively. The transfer layer 214a for forming the first buffer layer, the transfer layer 214b for forming the first light-emitting layer, and the transfer layer 214c for forming the first auxiliary layer may be formed on the first base film 211 by a typical deposition method.

The second donor substrate 220 may include a second base film 221, a second light-to-heat conversion layer 222, a second intermediate layer 223, and a transfer layer 224 for forming a red light-emitting layer.

The second base film 221 may be formed of the same material as the first base film 211. In an exemplary embodiment, both the first base film 211 and the second base film 221 may be polyethylene terephthalate films. In addition, a thickness of the second base film 221 may be equal to the thickness of the first base film 211. In an exemplary embodiment, both the thickness of the first base film 211 and the thickness of the second base film 221 may be 100 μm.

The second light-to-heat conversion layer 222 disposed on the second base film 221 may be formed of the same material as the first light-to-heat conversion layer 212. In an exemplary embodiment, both the first light-to-heat conversion layer 212 and the second light-to-heat conversion layer 222 may be metal layers which contain aluminum oxide as a light-absorbing material. In addition, a thickness of the second light-to-heat conversion layer 222 may be equal to the thickness of the first light-to-heat conversion layer 212. In an exemplary embodiment, both the thickness of the first light-to-heat conversion layer 212 and the thickness of the second light-to-heat conversion layer 222 may be 1,000 Å.

The second intermediate layer 223 disposed on the second light-to-heat conversion layer 222 may prevent the light absorbing material of the second light-to-heat conversion layer 222 from contaminating the transfer layer 224 formed in a subsequent process. The second intermediate layer 223 may be formed of the same material as the first intermediate layer 213. In an exemplary embodiment, both the first intermediate layer 213 and the second intermediate layer 223 may be formed of acrylic resin.

The transfer layer 224 for forming the red light-emitting layer may be disposed on the second intermediate layer 223. The transfer layer 224 for forming the red light-emitting layer may include a transfer layer 224a for forming a second buffer layer, a transfer layer 224b for forming a second light-emitting layer, and a transfer layer 224c for forming a second auxiliary layer stacked sequentially on the second intermediate layer 223.

The transfer layer 224a for forming the second buffer layer, the transfer layer 224b for forming the second light-emitting layer, and the transfer layer 224c for forming the second auxiliary layer may be formed of the same materials as the second buffer layer 153, the second light-emitting layer 152, and the second auxiliary layer 151, respectively. The transfer layer 224a for forming the second buffer layer, the transfer layer 224b for forming the second light-emitting layer, and the transfer layer 224c for forming the second auxiliary layer may be formed on the second base film 221 by a typical deposition method. Here, the transfer layer 224a for forming the second buffer layer may be formed of the same material as the transfer layer 214a for forming the first buffer layer. That is, both the transfer layer 214a for forming the first buffer layer and the transfer layer 224a for forming the second buffer layer may be formed of the green host material (the first host material), e.g., ADN.

Figure 3:
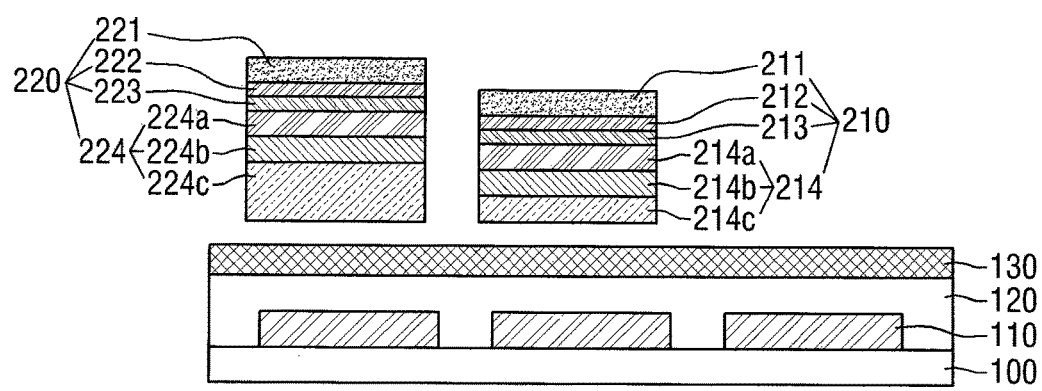
FIGS. 3 and 4 are cross-sectional views respectively illustrating steps of a method of manufacturing an organic light-emitting display device using the donor substrate set of FIG. 2.
Figure 4:
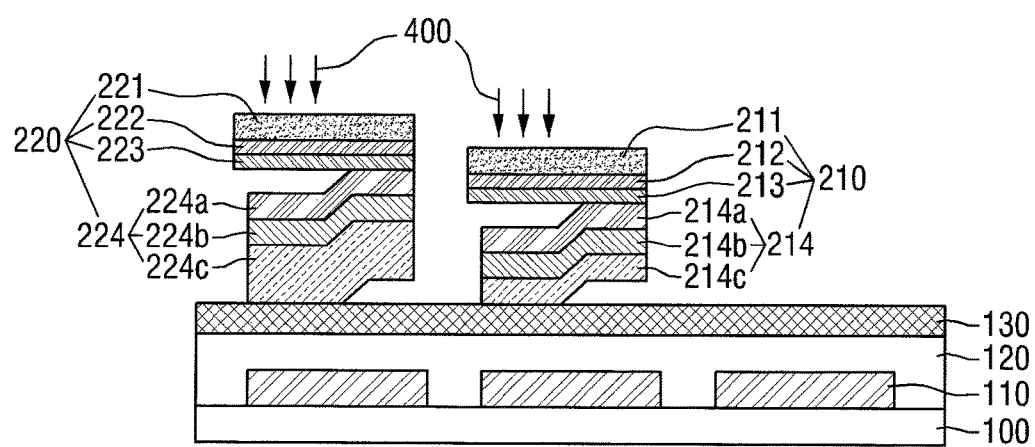

A method of manufacturing an organic light-emitting display device using the donor substrate set 200 according to an embodiment of the present invention will now be described with reference to FIGS. 3 and 4. FIGS. 3 and 4 are cross-sectional views respectively illustrating steps of a method of manufacturing an organic light-emitting display device using the donor substrate set 200 of FIG. 2. For simplicity, elements substantially identical to those of FIGS. 1 and 2 are indicated by like reference numerals, and thus a repetitive description thereof will be omitted.

Referring to FIGS. 3 and 4, a substrate 100 having a plurality of first electrodes 110 respectively formed on a first region (a green region) and a second region (a red region) thereof may be prepared. Then, a first medium layer 120 and a blue light-emitting layer 130 may be deposited on the substrate 100 using an open mask. A first donor substrate 210 may be formed by a deposition process and then placed such that a transfer layer 214 for forming a green light-emitting layer including a transfer layer 214b for forming a first light-emitting layer faces the substrate 100 with a gap therebetween. The transfer layer 214 for forming the green light-emitting layer may be transferred onto the first electrode 110 of the first region by irradiating the first region with a laser beam 400. As a result, a first organic layer pattern, that is, a green light-emitting layer 140 may be formed on the first electrode 110 of the first region.

Next, a second donor substrate 220 may be formed by a deposition process and then placed such that a transfer layer 224 for forming a red light-emitting layer including a transfer layer 224b for forming a second light-emitting layer faces the substrate 100 with a gap therebetween. The transfer layer 224 for forming the red light-emitting layer may be transferred onto the first electrode 110 of the second region by irradiating the second region with the laser beam 400. As a result, a second organic layer pattern, that is, a red light-emitting layer 150 may be formed on the first electrode 110 of the second region.

That is, as shown in FIGS. 3 and 4, the first donor substrate 210 and the second donor substrate 220 can be simultaneously placed on the substrate 100, and the transfer layer 214 for forming the green light-emitting layer and the transfer layer 224 for forming the red light-emitting layer can be simultaneously transferred. However, in another embodiment as described above, after the first donor substrate 210 is placed on the substrate 100 and the transfer layer 214 for forming the green light-emitting layer is transferred, the second donor substrate 220 may be placed on the substrate 100, and the transfer layer 224 for forming the red light-emitting layer may be transferred.

Next, a second medium layer 160, a second electrode 170 and a passivation layer 180 may be stacked sequentially by a deposition process.

Figure 5:
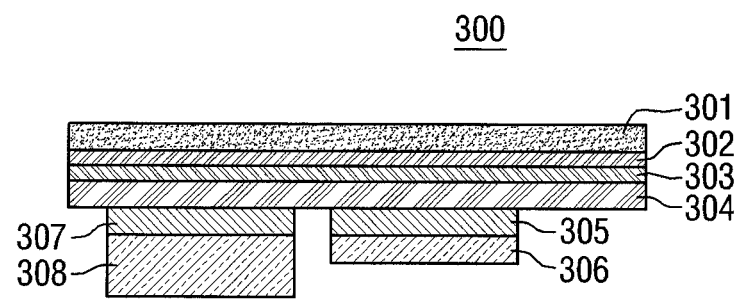
FIG. 5 is a cross-sectional view of a donor substrate according to an embodiment of the present invention.

The organic light-emitting display device according to the embodiment of FIG. 1 may also be manufactured using a single donor substrate 300. FIG. 5 is a cross-sectional view of a donor substrate 300 according to an embodiment of the present invention. Referring to FIG. 5, the donor substrate 300 may include a base film 301, a light-to-heat conversion layer 302, an intermediate layer 303, a buffer layer 304, a transfer layer 305 for forming a first light-emitting layer, a transfer layer 306 for forming a first auxiliary layer, a transfer layer 307 for forming a second light-emitting layer, and a transfer layer 308 for forming a second auxiliary layer.

The base film 301 may include a first region (a green region) and a second region (a red region). The base film 301 may be formed of the same material as the first base film 211 described above.

The light-to-heat conversion layer 302, the intermediate layer 303, and the buffer layer 304 stacked sequentially on the base film 301 may be formed of the same materials as the first light-to-heat conversion layer 212, the first intermediate layer 213, and the first buffer layer 143 described above, respectively.

The transfer layer 305 for forming the first light-emitting layer and the transfer layer 306 for forming the first auxiliary layer may be deposited sequentially on the buffer layer 304 of the first region by a deposition process.

The transfer layer 307 for forming the second light-emitting layer and the transfer layer 308 for forming the second auxiliary layer may be formed sequentially on the buffer layer 304 of the second region by a deposition process.

Figure 6:
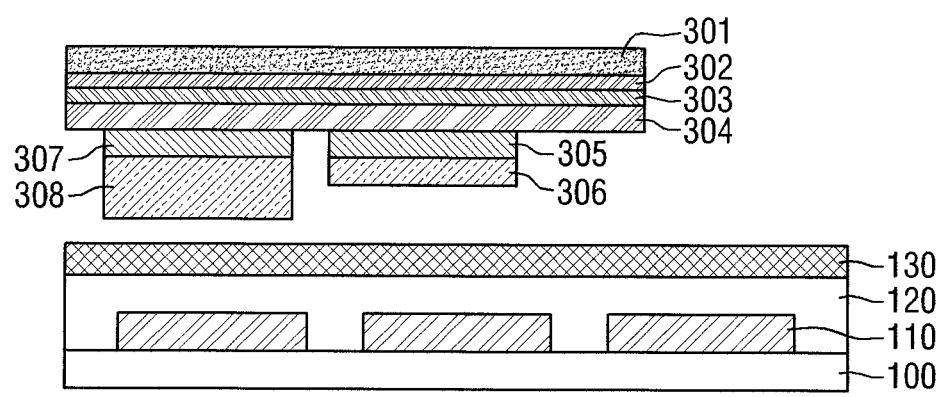
FIGS. 6 and 7 are cross-sectional views respectively illustrating steps of a method of manufacturing an organic light-emitting display device using the donor substrate of FIG. 5.
Figure 7:
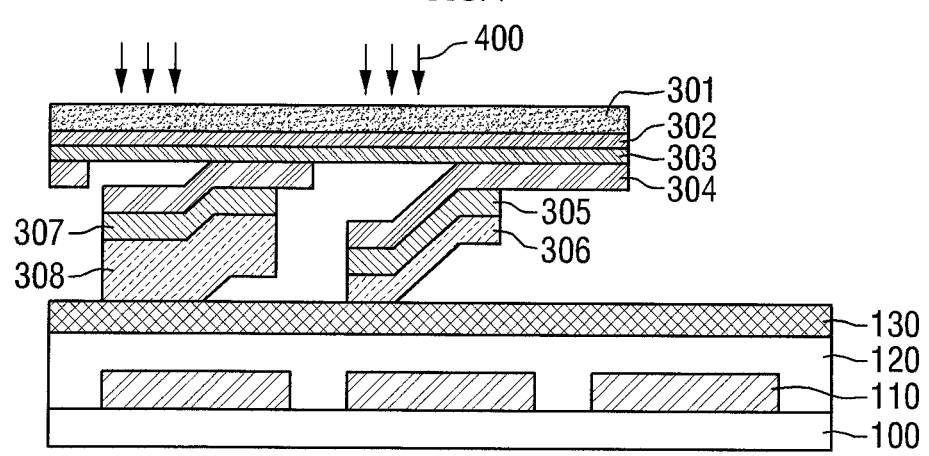

A method of manufacturing an organic light-emitting display device using the donor substrate 300 according to another embodiment of the present invention will now be described with reference to FIGS. 6 and 7. FIGS. 6 and 7 are cross-sectional views respectively illustrating steps of a method of manufacturing an organic light-emitting display device using the donor substrate 300 of FIG. 5. For simplicity, elements substantially identical to those of FIGS. 1 through 5 are indicated by like reference numerals, and thus a repetitive description thereof will be omitted.

Referring to FIGS. 6 and 7, a substrate 100 having a plurality of first electrodes 110 respectively formed on a first region and a second region thereof may be prepared. Then, a first medium layer 120 and a blue light-emitting layer 130 may be deposited on the substrate 100 using an open mask. A donor substrate 300 may be formed by a deposition process and then placed such that a transfer layer 305 for forming a first light-emitting layer and a transfer layer 307 for forming a second light-emitting layer face the substrate 100 with a gap therebetween. The first region and the second region may be irradiated with a laser beam 400, thereby forming organic layer patterns, that is, a green light-emitting layer 140 on the first electrode 110 of the first region and a red light-emitting layer 150 on the first electrode 110 of the second region.

Here, a portion of a buffer layer 304 overlapped by the transfer layer 305 for forming the first light-emitting layer and a portion of the buffer layer 304 overlapped by the transfer layer 307 for forming the second light-emitting layer may also be transferred, thereby forming a first buffer layer 143 and a second buffer layer 153, respectively.

Next, a second medium layer 160, a second electrode 170 and a passivation layer 180 may be stacked sequentially by a deposition process.

Figure 8:
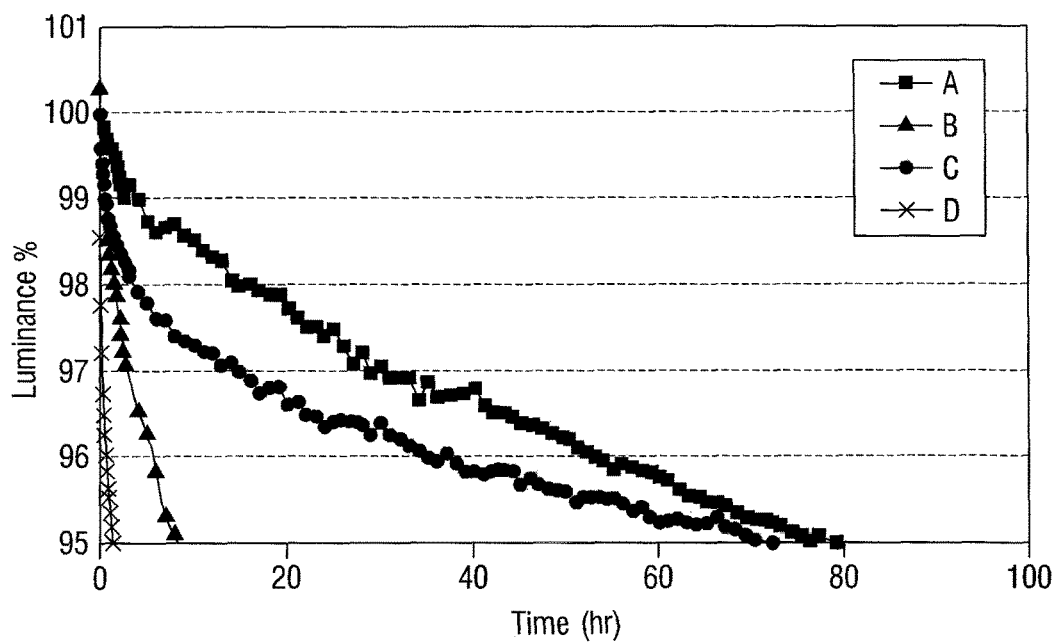
FIG. 8 is a graph illustrating luminance reduction rates over time of organic light-emitting display devices manufactured according to Examples 1 and 2 and Comparative Examples 1 and 2.

Hereinafter, the present invention will be described in further detail with reference to the following examples. The following examples are for illustrative purposes only and are not intended to limit the scope of the present invention. Luminance reduction rates over time of organic light-emitting display devices manufactured according to Examples 1 and 2 and Comparative Examples 1 and 2 will be described with reference to FIG. 8. FIG. 8 is a graph illustrating luminance reduction rates over time of organic light-emitting display devices manufactured according to Examples 1 and 2 and Comparative Examples 1 and 2.

Example 1

A plurality of first electrodes 110 were formed to a thickness of 500 Å by depositing ITO on a substrate 100, which contains $SiO_2$ as its main component, using a sputtering method.

A hole injection layer was formed to a thickness of 600 Å by depositing m-MTDATA on the first electrodes 110.

A hole transport layer was formed to a thickness of 150 Å by depositing NPB on the hole injection layer.

A blue light-emitting layer 130, which contains CBP as a blue host material and $F_2$Irpic as a blue dopant material, was deposited on the hole injection layer as a common layer by using an open mask. Here, the blue light-emitting layer 130 was formed to a thickness of 400 Å.

A green light-emitting layer 140 was formed on the blue light-emitting layer 130. The green light-emitting layer 140 was formed by an LITI method using a first donor substrate 210. The first donor substrate 210 was formed by sequentially stacking a first light-to-heat conversion layer 212 formed of aluminum oxide, a first intermediate layer 213 formed of acrylic resin, and a transfer layer 214 for forming a green light-emitting layer on a first base film 211 formed of polyethylene terephthalate. The transfer layer 214 for forming the green light-emitting layer was formed by sequentially stacking a transfer layer 214*a* for forming a first buffer layer, which was formed of ADN, a transfer layer 214*b* for forming a first light-emitting layer, which was formed of ADN and Ir(ppy)$_2$(acac), and a transfer layer 214*c* for forming a first auxiliary layer, which was formed of NPB, on the first intermediate layer 213. After the first donor substrate 210 was placed such that the transfer layer 214 for forming the green light-emitting layer faced the substrate 100 with a gap therebetween, the first donor substrate 210 and the substrate 100 were irradiated with a laser beam 400, thereby forming a green light-emitting layer 140.

In the green light-emitting layer 140, a first auxiliary layer 141, a first light-emitting layer 142, and a first buffer layer 143 were stacked sequentially. The first auxiliary layer 141 was formed of NPB to a thickness of 300 Å. The first light-emitting layer 142 was formed of ADN (i.e., a green host material) and Ir(ppy)$_2$(acac) (i.e., a green dopant material) to a thickness of 300 Å. The first buffer layer 143 was formed of ADN (i.e., the green host material) to a thickness of 300 Å.

An electron transport layer was formed to a thickness of 300 Å by depositing Alq3 on the green light-emitting layer 140.

An electron injection layer was formed to a thickness of 5 Å by depositing LiF on the electron transport layer.

A second electrode 170 was formed to a thickness of 800 Å by depositing Al on the electron injection layer.

A passivation layer 180 was formed to a thickness of 500 Å by depositing $SiO_2$ on the second electrode 170.

An organic light-emitting display device manufactured according to Example 1 showed a maximum current efficiency of 65.2 Cd/A and a maximum power efficiency of 30.4 lm/W.

In FIG. 8, the luminance reduction rate over time of the organic light-emitting display device manufactured according to Example 1 is represented by a graph A.

Example 2

An organic light-emitting display device was manufactured in the same way as in Example 1 except that a red light-emitting layer 150 was formed on the above blue light-emitting layer 130. The red light-emitting layer 150 was formed by an LITI method using a second donor substrate 220. The second donor substrate 220 was formed by sequentially stacking a second light-to-heat conversion layer 222 formed of aluminum oxide, a second intermediate layer 223 formed of acrylic resin, and a transfer layer 224 for forming a red light-emitting layer on a second base film 221 formed of polyethylene terephthalate. The transfer layer 224 for forming the red light-emitting layer was formed by sequentially stacking a transfer layer 224*a* for forming a second buffer layer, which was formed of ADN, a transfer layer 224*b* for forming a second light-emitting layer, which was formed of bis-(2-methyl-8-quinolinolate)-4-(phenylphenolate)aluminum and PtOEP, and a transfer layer 224*c* for forming a second auxiliary layer, which was formed of NPB, on the second intermediate layer 223. After the second donor substrate 220 was placed such that the transfer layer 224 for forming the red light-emitting layer faced the substrate 100 with a gap therebetween, the second donor substrate 220 and the substrate 100 were irradiated with the laser beam 400, thereby forming the red light-emitting layer 150.

In the red light-emitting layer 150, a second auxiliary layer 151, a second light-emitting layer 152, and a second buffer layer 153 were stacked sequentially. The second auxiliary layer 151 was formed of NPB to a thickness of 500 Å. The second light-emitting layer 152 was formed of bis-(2-methyl-8-quinolinolate)-4-(phenylphenolate)aluminum (i.e., a red host material) and PtOEP (i.e., a red dopant material) to a thickness of 300 Å. The second buffer layer 153 was formed of ADN (i.e., the green host material) to a thickness of 300 Å.

The organic light-emitting display device manufactured according to Example 2 showed a maximum current efficiency of 41.5 Cd/A and a maximum power efficiency of 18.9 lm/W.

In FIG. 8, the luminance reduction rate over time of the organic light-emitting display device manufactured according to Example 2 is represented by a graph C.

Comparative Example 1

An organic light-emitting display device was manufactured in the same way as in Example 1 except that a first buffer layer 143 was formed of bis-(2-methyl-8-quinolinolate)-4-(phenylphenolate)aluminum which is the red host material.

The organic light-emitting display device manufactured according to Comparative Example 1 showed a maximum current efficiency of 49.6 Cd/A and a maximum power efficiency of 23.2 lm/W.

In FIG. 8, the luminance reduction rate over time of the organic light-emitting display device manufactured according to Comparative Example 1 is represented by a graph B.

Comparative Example 2

An organic light-emitting display device was manufactured in the same way as in Example 2 except that a second buffer layer 153 was formed of bis-(2-methyl-8-quinolinolate)-4-(phenylphenolate)aluminum which is the red host material.

The organic light-emitting display device manufactured according to Comparative Example 2 showed a maximum current efficiency of 24.2 Cd/A and a maximum power efficiency of 9.0 lm/W.

In FIG. 8, the luminance reduction rate over time of the organic light-emitting display device manufactured according to Comparative Example 2 is represented by a graph D.

As is apparent from the above examples, a green light-emitting layer (Example 1) including a buffer layer formed of the green host material exhibited higher luminous efficiency than a green light-emitting layer (Comparative Example 1) including a buffer layer formed of the red host material. In addition, the green light-emitting layer (Example 1) including the buffer layer formed of the green host material had a longer lifetime than the green light-emitting layer (Comparative Example 1) including the buffer layer formed of the red host material. Here, the lifetime may correspond to a luminance reduction rate over time.

Furthermore, a red light-emitting layer (Example 2) including a buffer layer formed of the green host material exhibited higher luminous efficiency than a red light-emitting layer (Comparative Example 2) including a buffer layer formed of the red host material. In addition, the red light-emitting layer (Example 2) including the buffer layer formed of the green host material had a longer lifetime than the red light-emitting layer (Comparative Example 2) including the buffer layer formed of the red host material.

When a green light-emitting layer and a red light-emitting layer are formed using an LITI method, the same base film and the same buffer layer can be used for a donor substrate for forming the green light-emitting layer and for a donor substrate for forming the red light-emitting layer. Therefore, this can reduce the number of process variables and the time required to identify the cause of defects. Also, material costs can be reduced.

If a buffer layer formed of the green host material is used in the LITI method, dot non-transfer defects of the green light-emitting layer and the red light-emitting layer can be improved.

Embodiments of the present invention provide at least one of the following advantages.

That is, since a green light-emitting layer and a red light-emitting layer include the same buffer layer which contains a green host material, the luminous efficiency and lifetime of an organic light-emitting display device can be improved.

In addition, when the green light-emitting layer and the red light-emitting layer are formed using an LITI method, the same base film and the same buffer layer can be used for a donor substrate for forming the green light-emitting layer and for a donor substrate for forming the red light-emitting layer. Therefore, this can reduce process variables and the time required to identify the cause of defects. Also, material costs can be reduced.

If a buffer layer formed of the green host material is used in the LITI method, dot non-transfer defects of the green light-emitting layer and the red light-emitting layer can be improved.

However, the effects of the present invention are not restricted to the ones set forth herein. The above and other effects of the present invention will become more apparent to one of ordinary skill in the art to which the present invention pertains by referencing the claims.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A donor substrate comprising:
   a base film comprising a first region and a second region;
   a buffer layer on the base film, the buffer layer comprising a first host material;
   a transfer layer, having a first thickness, for forming a first light-emitting layer, the transfer layer for forming the first light-emitting layer being on the first region of the buffer layer and comprising the first host material and a first dopant material; and
   a transfer layer, having a second thickness which is different from the first thickness, for forming a second light-emitting layer, the transfer layer for forming the second light-emitting layer being on the second region of the buffer layer and comprising a second host material and a second dopant material,
   wherein the transfer layer for forming the first light-emitting layer and the transfer layer for forming the second light-emitting layer are separated from each other on the base film.

2. The donor substrate of claim 1, further comprising:
   a transfer layer for forming a first auxiliary layer, the transfer layer for forming the first auxiliary layer being on the transfer layer for forming the first light-emitting layer; and
   a transfer layer for forming a second auxiliary layer, the transfer layer for forming the second auxiliary layer being on the transfer layer for forming the second light-emitting layer.

3. The donor substrate of claim 1, further comprising a light-to-heat conversion layer which is formed between the base film and the buffer layer.

4. The donor substrate of claim 3, further comprising an intermediate layer between the light-to-heat conversion layer and the buffer layer.

* * * * *